United States Patent
Maeda et al.

(10) Patent No.: US 6,624,084 B2
(45) Date of Patent: Sep. 23, 2003

(54) PLASMA PROCESSING EQUIPMENT AND PLASMA PROCESSING METHOD USING THE SAME

(75) Inventors: Kenji Maeda, Matsudo (JP); Yutaka Omoto, Hikari (JP); Ichiro Sasaki, Yokohama (JP); Hironobu Kawahara, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 123 days.

(21) Appl. No.: 09/741,996

(22) Filed: Dec. 22, 2000

(65) Prior Publication Data

US 2001/0022293 A1 Sep. 20, 2001

(30) Foreign Application Priority Data

Dec. 27, 1999 (JP) ............................................. 11-370136

(51) Int. Cl.[7] .............................................. H01L 21/00
(52) U.S. Cl. ............. 438/732; 156/345.37; 156/345.48; 216/67; 216/68; 438/715; 438/716; 438/729
(58) Field of Search ........................ 156/345.37, 345.47, 156/345.48, 915; 438/715, 716, 728, 729, 732; 216/67, 68

(56) References Cited

U.S. PATENT DOCUMENTS

| | | | | |
|---|---|---|---|---|
| 5,556,500 A | * | 9/1996 | Hasegawa et al. | ...... 156/915 X |
| 5,942,075 A | * | 8/1999 | Nagahata et al. | ... 156/345.47 X |
| 6,068,784 A | * | 5/2000 | Collins et al. | ...... 156/345.48 X |
| 6,290,806 B1 | * | 9/2001 | Donohoe | ................. 156/915 X |

FOREIGN PATENT DOCUMENTS

| JP | 7-297175 | 11/1995 |
|---|---|---|
| JP | 9-321031 | 12/1997 |

* cited by examiner

Primary Examiner—William A. Powell
(74) Attorney, Agent, or Firm—Antonelli, Terry, Stout & Kraus, LLP

(57) ABSTRACT

In plasma processing equipment having a vacuum processing chamber, a plasma generation means, a stage for loading a wafer to be processed in the vacuum processing chamber, an opposing electrode having an area almost equal to or wider than the aforementioned wafer which is installed opposite to the stage, and a bias power source for applying a high frequency bias to the wafer, a current path correction means is provided for correcting the current path part in the neighborhood of the outer periphery of the wafer among the high frequency current paths produced by the high frequency bias so as to be directed toward the wafer opposing surface of the opposing electrode.

24 Claims, 11 Drawing Sheets

(THE EQUIVALENT CIRCUIT OF PLASMA IS INDICATED MORE SIMPLY THAN THAT SHOWN IN FIG.3 FOR SIMPLICITY.)

PLASMA PROCESSING EQUIPMENT AND PLASMA PROCESSING METHOD USING THE SAME

BACKGROUND OF THE INVENTION

The present invention relates to a plasma processing method and a processing device suited to perform processing, such as etching, using plasma for metallic materials, such as aluminum, copper, platinum, and others, for insulating materials, such as silicone oxide, silicon nitride, and others, and for organic materials, such as a low dielectric constant film (low-k film), in the manufacturing process of semiconductor devices; and, more particularly, the invention relates to plasma processing equipment and a plasma processing method for processing especially fine patterns in a damage-free manner.

In the process of manufacturing semiconductor devices, such as a DRAM, microprocessor and ASIC, plasma processing using a weak ionizing plasma is widely used. In the plasma process, ions and radicals generated by plasma are irradiated on a wafer to be processed. As a refinement of semiconductor device advances, for plasma etching equipment used for processing wires, gate electrodes and contact holes, finer processing characteristics, high selectivity, high processing uniformity and low damage are required.

As a plasma source for etching equipment which has been used for many years, there is a parallel plate type plasma source. The parallel plate type plasma is called a CCP (capacitive coupled plasma) because the coupling of the plasma and power is capacitive. The parallel plate type plasma source has a comparatively simple device configuration and performs anisotropic etching using a comparatively high self bias generated when a blocking capacitor is inserted on the anode electrode side. However, as the pattern size of semiconductor devices becomes smaller, it is difficult to generate high-density plasma at a low pressure.

As a result, Japanese Patent Application Laid-Open 7-297175,IEM (ion energy modulation) indicates that, by applying high frequency waves of several tens MHz to the upper electrode of a narrow electrode parallel plate type reactor, a comparatively high-density plasma is generated, and by applying a bias of several hundreds of kHz to the lower electrode on which a wafer to be processed is disposed, the ion amount to be irradiated to the wafer to be processed is controlled. The pressure for stably generating plasma using IEM is high, such as several tens Pa to 5 Pa. However, to achieve further refinement of the pattern size, it is desirable to generate a plasma at a lower pressure.

In recent years, to produce inductively coupled plasma (ICP), a coil is wound around the side or top of a dielectric container and plasma is maintained by an induction field generated by supplying an alternating current to the coil. The ICP process can generate high-density plasma at a low pressure.

As a plasma source for generating high-density plasma at a low pressure, there is a magnetic field microwave type plasma source using electron cyclotron resonance (ECR). At a magnetic flux density of 875 G, the electron Larmor frequency becomes 2.45 GHz, and by resonance with the power frequency, plasma can be generated efficiently even at a low pressure.

Furthermore, a new plasma source for high-density plasma at a low electron temperature has been proposed. For example, Japanese Patent Application Laid-Open 9-321031 describes a UHF-ECR device using the UHF band of frequency of 300 MHz to 1 GHz, instead of a microwave for exciting the plasma. With respect to plasma excited by electromagnetic waves of the UHF band, the electron temperature is low, and the dissociation of the processing gas can be kept to an optimum condition, and, furthermore, the magnetic flux density for causing the ECR can be controlled to a low value, so that it is also advantageous in preventing damage.

Although the aforementioned ICP process can generate high-density plasma at a low pressure, the high density invites a disaster depending on the process, in that the dissociation of the processing gas advances extremely, and a problem arises in that a favorable selection ratio to the mask material or substrate material is not obtained.

In the aforementioned ECR, the high density and high electron temperature invite a disaster depending on the process, in that the dissociation of the processing gas advances extremely, and a problem arises in that a favorable selection ratio to the mask material or substrate material is not obtained. The problems of bias non-uniformity caused by the magnetic field and charging damage cannot be ignored.

When an etching process is to be performed using each of the aforementioned plasma sources, under the condition that the processing speed on the wafer surface is uniform, only the processing speed is uniform, and, although the plasma parameters, such as the plasma density, electron temperature, and plasma potential, are almost uniform, it cannot be said that they are strictly uniform.

The etching speed is determined by the balance between ions generated by the plasma, radicals, and reaction products generated by the etching. The density of the reaction products in the neighborhood of a wafer is always high at the center of the wafer, if the etching speed on the wafer is uniform, so that, to cancel it, the ion distribution, under the condition that the processing speed is uniform, is always crowning.

As mentioned above, to make the processing speed uniform, the plasma distribution is adjusted to be slightly non-uniform. Even if the plasma density is uniform, the electron temperature and plasma potential may become naturally non-uniform.

Meanwhile, in order to achieve refinement of semiconductor devices, the minimum processing size at the time of manufacture of the devices is becoming smaller year by year, and in correspondence to this, the thickness of the oxide film of the gate becomes thin, for example, to about several nm.

When the oxide film of the gate becomes extremely thin, the withstand voltage of the oxide film becomes low, so that the semiconductor device becomes very sensitive to damage when the oxide film is exposed to plasma. One example of charging damage caused by plasma is macro damage. This phenomenon will be explained with reference to FIGS. 14A to 14C.

At the time of etching, after the plasma is ignited, a high frequency bias is generally applied to a wafer. Ions are pulled in the wafer by the high frequency bias, and, hence, etching of high anisotropy is realized. When the high frequency bias is applied, depending on the difference in the displacement between the electrons and the ions, as shown in FIG. 14A, a self bias Vdc is generated on the wafer.

As described previously, the etching process is performed under the condition that the processing speed on the wafer surface is uniform. However, only the processing speed is uniform, and it cannot be said always that the plasma parameters are uniform. Therefore, the aforementioned self bias Vdc, as shown in FIG. 14B, may be different depending on the position on the wafer.

When the self bias voltage Vdc on the wafer surface is more than the withstand voltage of the oxide film of the gate, as shown in FIG. 14C, the current flows through the plasma as a part of the circuit and the device breaks. Namely, macro damage is generated.

FIG. 15 shows an example of the current-voltage characteristic of an oxide film of the gate. Although the characteristic is different depending on the conditions, such as the thickness of the oxide film of the gate, when a voltage between 7 V and 8 V or so is applied to the oxide film of the gate, the oxide film of the gate is subjected to a dielectric breakdown. When the thickness of the oxide film is made thinner, the withstand voltage will be naturally lowered. When the difference in the self bias potential on the wafer surface is more than 7 V, macro damage is generated.

The non-uniformity of the self bias as shown in FIG. 14B can be seen often when a magnetic field is applied to a plasma. The reason for this is that the motion of electrons is restricted by the magnetic field, and the impedance of the plasma is different between the crossing direction of the magnetic field and the parallel direction with the magnetic field. This will be explained by referring to a schematic view.

FIG. 16 shows an equivalent circuit of plasma viewed from a high frequency bias. The magnetic field, as shown in FIG. 16, enters almost perpendicularly to the wafer. The current flowing through the plasma is mostly comprised of electrons. However, when there is a magnetic field, electrons make the Larmor rotation around the lines of magnetic force, so that the motion across the lines of magnetic force is difficult. Therefore, the impedance of plasma in the crossing direction of the lines of magnetic force is larger than that in the parallel direction with the magnetic field. Therefore, a potential difference is apt to be generated in the crossing direction of FIG. 16, and it appears as a non-uniformity of the bias and causes macro damage. A mechanism for causing this non-uniformity of the bias will be explained hereunder.

FIG. 13A is a diagram showing the concept of a conventional processing method, for example, in which the current path of a high frequency bias applied to a wafer is not limited to the opposing electrode. Generally, when a high frequency bias is applied to a lower electrode, a negative self bias is generated. The reason for this is that the side wall of the processing chamber operates as a ground (electrode) for the lower electrode, and the area of the ground (electrode) becomes larger than the area of the lower electrode. Since the current path of the high frequency bias is not limited to the opposing electrode and the outer periphery of the wafer is adversely affected by the ground of the side wall of the processing chamber, the effective ground area as viewed from the high frequency bias is larger at the outer periphery of the wafer than in the center part of the wafer. Namely, the impedance up to the ground as viewed from the high frequency bias is non-nuiform in the wafer surface, and the impedance, in other words, the negative self bias, is larger on the outer part of the wafer surface than on the inner part.

When the magnetic field is applied perpendicularly to the processing chamber, the plasma impedance in the crossing direction of the magnetic field is large. When a high frequency bias voltage is applied to such a magnetized plasma, unless the current path of the high frequency bias is limited to the opposing electrode, at the center part of the wafer, the high frequency bias current flows only through the opposing electrode, and in the outer periphery of the wafer, the high frequency bias current also flows through the opposing electrode and side wall of the processing chamber. When the high frequency bias current flows through the side wall of the processing chamber, as mentioned above, the plasma impedance in the crossing direction of the magnetic field is large, so that a larger voltage drop is generated. Namely, as shown in FIG. 13B, the self bias generated at the center of the wafer is different from the self bias generated in the outer periphery of the wafer, and, as shown in FIG. 14B, the absolute value of the self bias potential in the outer periphery of the wafer is larger. As a result, the self bias potential on the wafer becomes non-uniform, and, as shown in FIG. 14C, a current flows through the device via the plasma. As a result, the processing method shown in FIG. 13A may cause macro damage easily.

Although non-uniformity of the plasma impedance due to the magnetic field is assumed for purposes of explanation, even if no magnetic field is applied, the same phenomenon may be generated due to non-uniformity of the electron temperature and other factor. As described previously, under the condition that the processing speed is uniform, the plasma is not always uniform, and when a radial distribution of the plasma impedance is generated due to a spatial non-uniformity, such as the plasma density and electron temperature, a non-uniformity of the bias and macro damage results.

SUMMARY OF THE INVENTION

An object of the present invention is to eliminate the aforementioned bias non-uniformity and to provide a plasma processing method which is free of macro damage and plasma processing equipment which is free of macro damage.

Another object of the present invention is to provide a plasma processing method and processing device for processing even fine patterns having a processing size of 0.2 mm or less without damage.

A characteristic of the present invention is that, in plasma processing equipment having a vacuum processing chamber, a plasma generation means, a stage for loading a wafer to be processed in the vacuum processing chamber, an opposing electrode having an area almost equal to or wider than the aforementioned wafer, which is installed opposite to the stage, and a bias power source for applying a high frequency bias to the wafer, a current path correction means is provided for correcting the part of the current path in the neighborhood of the outer periphery of the wafer among the high frequency current path by the high frequency bias so as to look toward the wafer opposing surface of the opposing electrode.

Another characteristic of the present invention is that, in plasma processing equipment having a vacuum processing chamber, a plasma generation means, a stage for loading a wafer to be processed in the vacuum processing chamber, an opposing electrode having an area almost equal to or wider than the aforementioned wafer, which is installed opposite to the stage, a ground, and a bias power source for applying a high frequency bias to the wafer, an impedance adjustment means is provided for making the impedance up to the ground as viewed from the high frequency bias almost uniform on the wafer surface.

Still another characteristic of the present invention is in the provision a plasma processing method performed by plasma processing equipment having a vacuum processing chamber, a plasma generation means, a stage for loading a wafer to be processed in the vacuum processing chamber, an opposing electrode having an area almost equal to or wider than the aforementioned wafer, which is installed opposite to the stage, and a bias power source for applying a high frequency bias to the wafer and including a current path correction means for correcting the current path part in the neighborhood of the outer periphery of the wafer among the high frequency current path by the high frequency bias so as to look toward the wafer opposing surface of the opposing electrode, which method comprises a step of introducing processing gas into the vacuum processing chamber, a step of turning power on, igniting a plasma, applying a high frequency bias to the wafer, and generating a uniform self bias potential on the wafer when the high frequency bias is applied by the current path correction means, and a step of processing the wafer using the plasma.

Macro damage is caused by non-uniformity of a self bias in the wafer surface which is generated when a high frequency bias is applied so as to attractions to the wafer after the plasma is ignited. Therefore, even if the plasma has a slight non-uniformity, when the self bias is made uniform according to the present invention, macro damage can be prevented.

Namely, according to the present invention, since no current flows through the device via the plasma, macro damage can be prevented. Furthermore, according to another characteristic of the present invention, the self bias potential on the bias becomes uniform and macro damage can be prevented.

DETAILED DESCRIPTION OF PREFERRED EMBODIMENTS

Next, the concept of the present invention will be explained. In FIGS. 1A to 1C, 2A and 2B, the outline of the current path correction means for correcting the part of the current path in the neighborhood of the outer periphery of the wafer among the high frequency current path parts, by the high frequency bias, so as to look toward the wafer opposing surface of the opposing electrode, which is the characteristic of the present invention, is indicated. The impedance adjustment means for making the impedance up to the ground as viewed from the high frequency bias almost uniform on the wafer surface, which is the characteristic of the present invention, is also indicated.

Figure 1A:
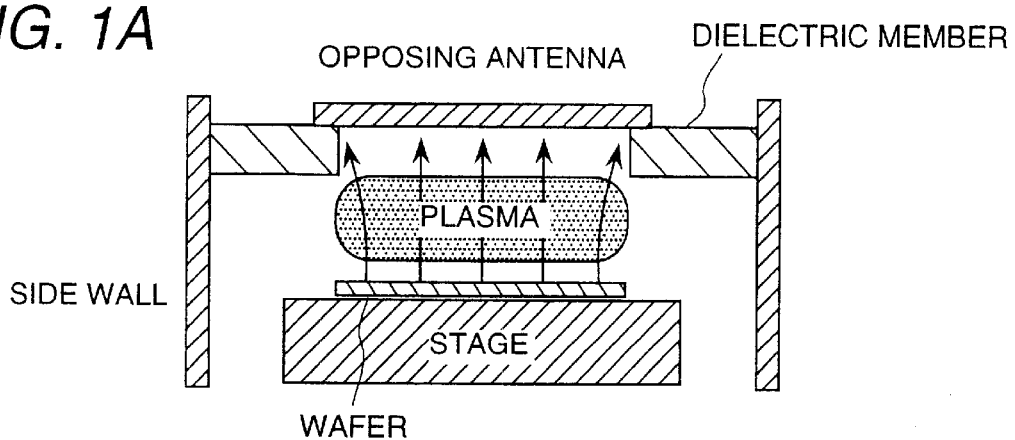
FIGS. 1A to 1C are schematic diagrams showing a current path of a high frequency bias for illustrating a concept of the present invention.

In the processing method shown in FIG. 1A, when the outer periphery of the opposing electrode is provided with a dielectric structure and plasma is confirmed only at the upper part of the wafer, the plasma density in the neighborhood of the side wall of the processing chamber is lowered and the high frequency bias current path to the side wall is interrupted. The arrows shown in the drawing indicate the RF bias current path.

Figure 13A:
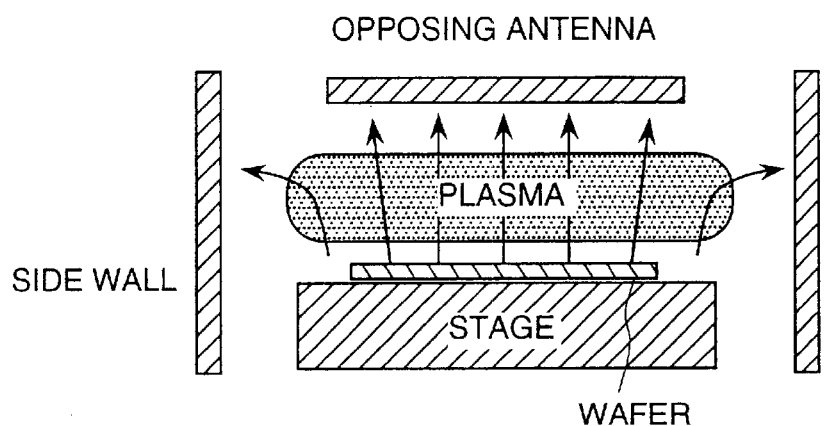
FIG. 13A is a schematic view showing a current path of a high frequency bias in a conventional appartus.

By doing this, the current path of the high frequency bias applied to the outer periphery of the wafer is limited to the opposing electrode. As a result, the difference between a self bias generated at the center and a self bias generated in the outer periphery of the wafer becomes smaller, and, as compared with the conventional example shown in FIG. 13A, the self bias potential on the wafer becomes uniform and macro damage can be prevented.

In the above explanation, as a means for limiting the high frequency bias current applied to the wafer to the area of the opposing electrode, an example of reducing the plasma density in the neighborhood of the side wall of the processing chamber is described. However, the present invention is not limited thereto. For example, when the whole side wall is covered with a dielectric film sufficiently thick to prevent the high frequency bias, the high frequency bias current can be limited to the opposing electrode. The means for reducing the plasma density in the neighborhood of the side wall of the processing chamber may take any form.

Figure 1B:
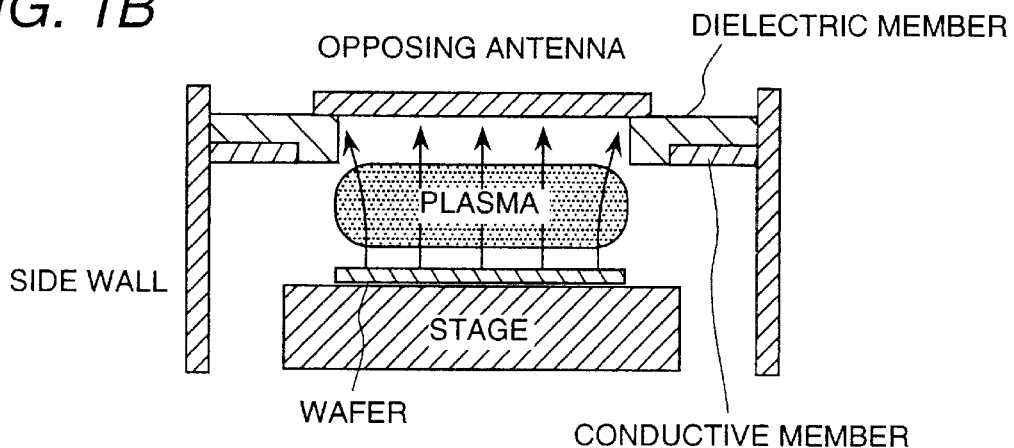

FIG. 1B shows another embodiment of the present invention in which a conductive member is arranged on the bottom of a dielectric member. By use of such a constitution, UHF electromagnetic waves radiated to the bottom of the conductive member are prevented and generation of plasma in the neighborhood of the wall is suppressed, with the result that the plasma can be confined to only the upper part of the wafer. As a material to form the bottom of the conductive member, so as to prevent a wafer from the effects of heavy metal contamination, silicon, silicon carbide, or aluminum with the surface anodized is desirable.

Furthermore, in a plasma processing apparatus having a focus ring made of an almost circular ring-shaped dielectric or conductor insulated from a wafer in the outer periphery of the wafer, by using a plasma processing method comprising (1) a step of introducing processing gas into a vacuum processing chamber, (2) a step of igniting a plasma, (3) a step of applying a high frequency bias to the wafer and simultaneously applying a high frequency bias also to the focus ring installed at the outer periphery of the wafer, (4) a step of setting the current path of the high frequency bias to be applied to the focus ring to other than the opposing ground, and (5) a step of limiting the high frequency current path of the high frequency bias applied to the wafer to the opposing electrode positioned on the wafer opposing surface, the self bias potential on the wafer becomes uniform and macro damage can be prevented.

Figure 1C:
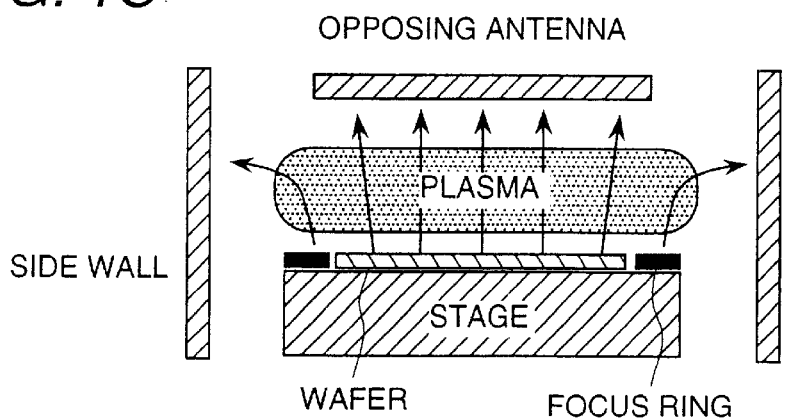
Figure 13B:
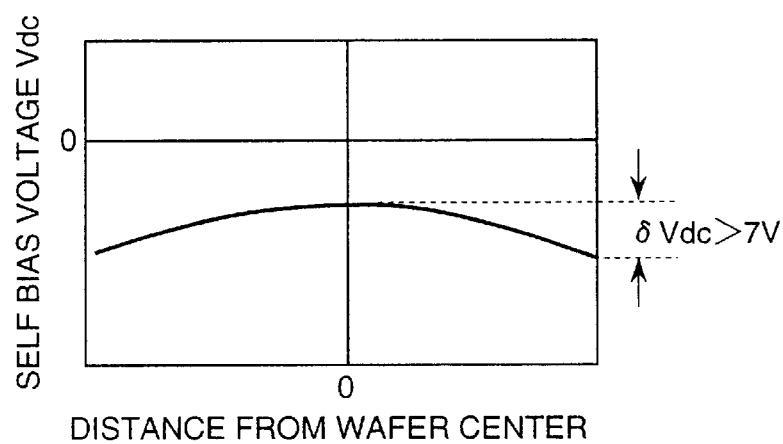
FIG. 13B is a graph of self bias voltage versus distance from wafer center.
Figure 14A:
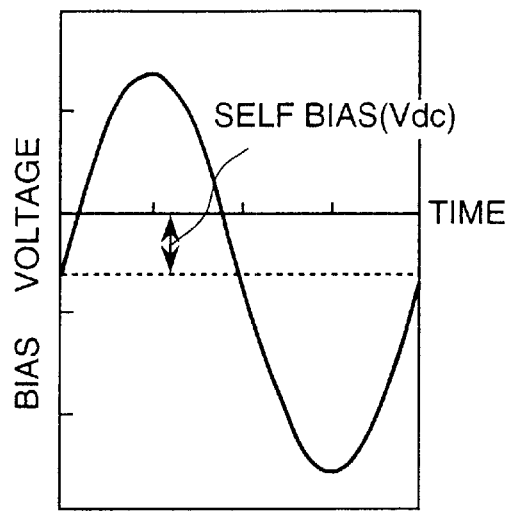
FIGS. 14A to 14C are diagrams illustrating the phenomenon responsible for generation of macro damage in a conventional apparatus.
Figure 14B:
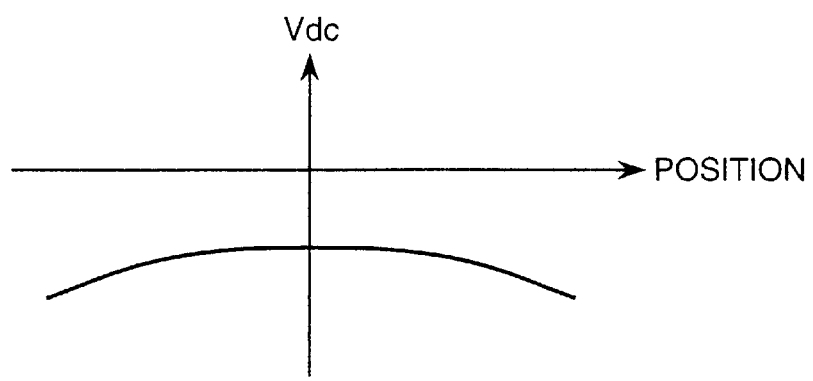
Figure 14C:
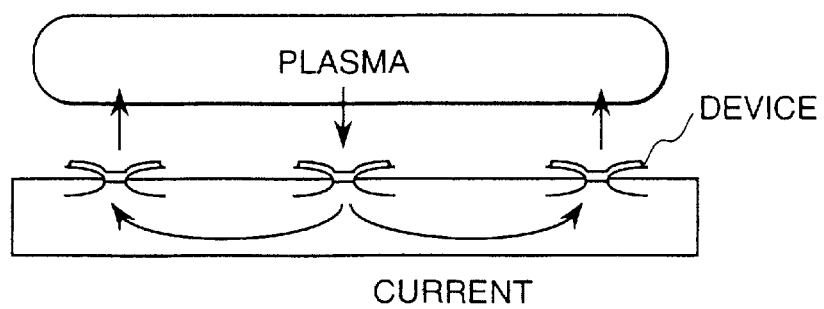
Figure 15:
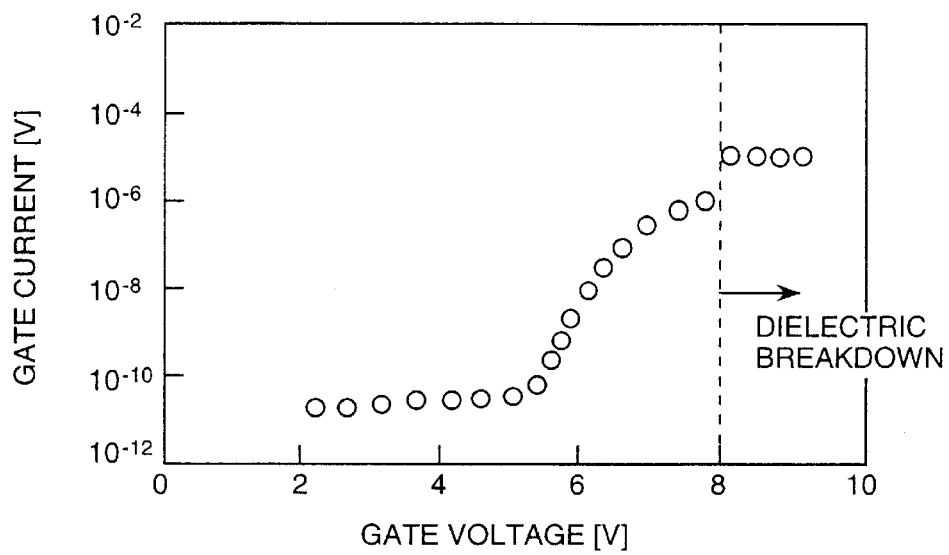
FIG. 15 is a diagram showing an example of a current-voltage characteristic of an oxide film of a gate.
Figure 16:
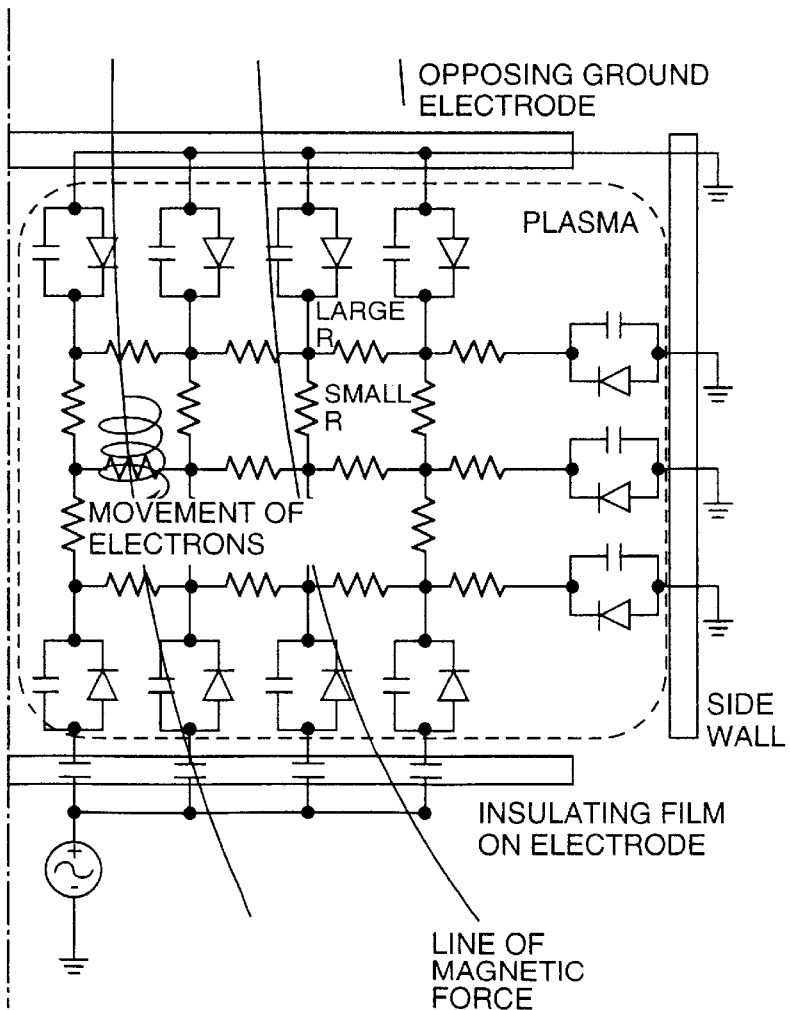
FIG. 16 is a schematic diagram showing an equivalent circuit of plasma viewed from a high frequency bias.

Namely, as shown in FIG. 1C, when the high frequency bias is applied to the focus ring, a high frequency current from the focus ring flows toward the side wall of the processing chamber and the high frequency current path of the high frequency bias applied to the wafer is limited to the opposing electrode positioned on the wafer opposing surface. As a result, the difference between a self bias generated at the center part and a self bias generated in the outer periphery of the wafer becomes smaller, and, as compared with FIG. 13, the self bias potential on the wafer becomes uniform and macro damage can be prevented.

Figure 2A:
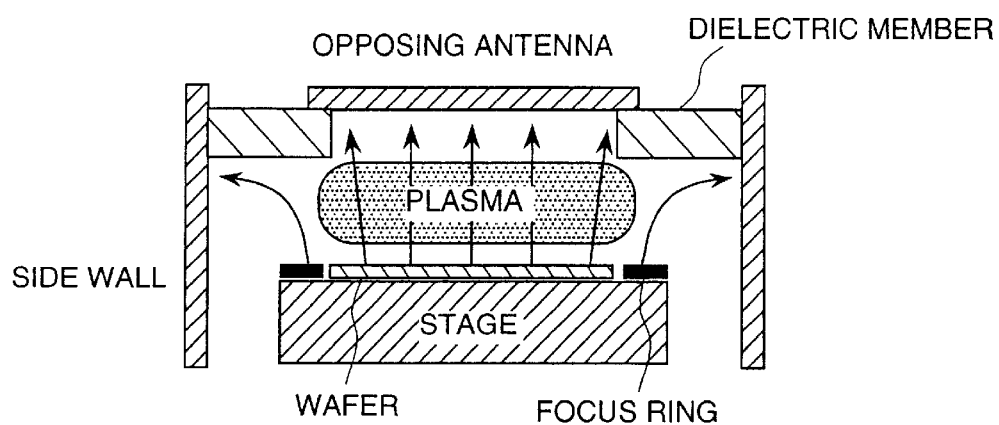
FIG. 2A is a schematic view showing a current path of a high frequency bias of another example of the present invention.
Figure 2B:
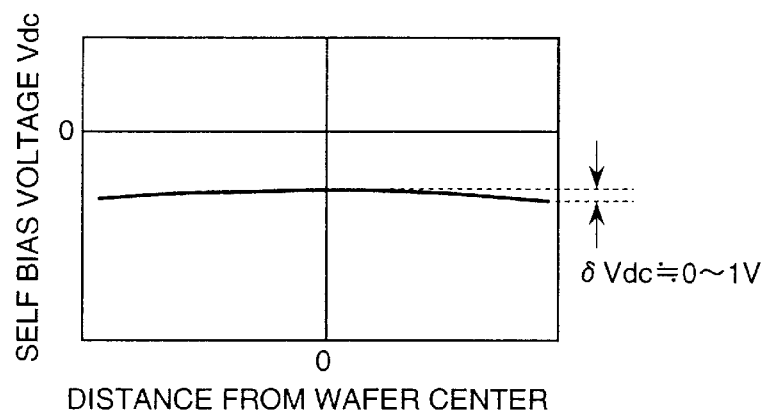
FIG. 2B is a graph showing self bias voltage versus distance from the wafer center.

Furthermore, as shown in FIG. 2A, when the processing methods shown in FIGS. 1A and 1C are used together, needless to say, another effect can be expected. Also, in this example, the difference between a self bias generated at the center and a self bias generated at the outer periphery of the wafer becomes smaller, and, as shown in FIG. 2B, the self bias potential on the wafer becomes uniform and macro damage can be prevented. In FIG. 2B, dVdc is exaggeratingly shown to assist in understanding the concept being illustrated. When the self bias is measured within the range of 8 inches from the center of the wafer while using the features of the present invention, dVdc can be reduced to 0 to 1 V or so.

In the above explanation, from the viewpoint of the high frequency bias current path flowing through the plasma, a processing method for making the self bias potential uniform and preventing macro damage is described. By adjusting not only the plasma side, but also the impedance for the high frequency bias, including the wafer loading stage and opposing electrode, the self bias potential may be made uniform on the wafer surface.

Namely, by using a plasma processing method comprising (1) a step of introducing processing gas into a vacuum processing chamber, (2) a step of igniting a plasma, (3) a step of applying a high frequency bias to a wafer, and (4) a step of making the impedance viewed from the high frequency bias uniform on the wafer, the self bias potential on the wafer becomes uniform and macro damage can be prevented.

For example, even if the aforementioned processing method is not used and the plasma impedance for the high frequency bias is different between the center part of the wafer and the outer periphery of the wafer, it is desirable to design the apparatus so that the impedance for the high frequency bias of the wafer loading stage or opposing electrode is made intentionally different between the center and the outer periphery so as to cancel the difference in the plasma impedance.

Furthermore, this method may be used together with the processing method for limiting the high frequency current path flowing through plasma to the opposing electrode and making the self bias potential uniform.

EMBODIMENTS OF THE INVENTION

Figure 3:
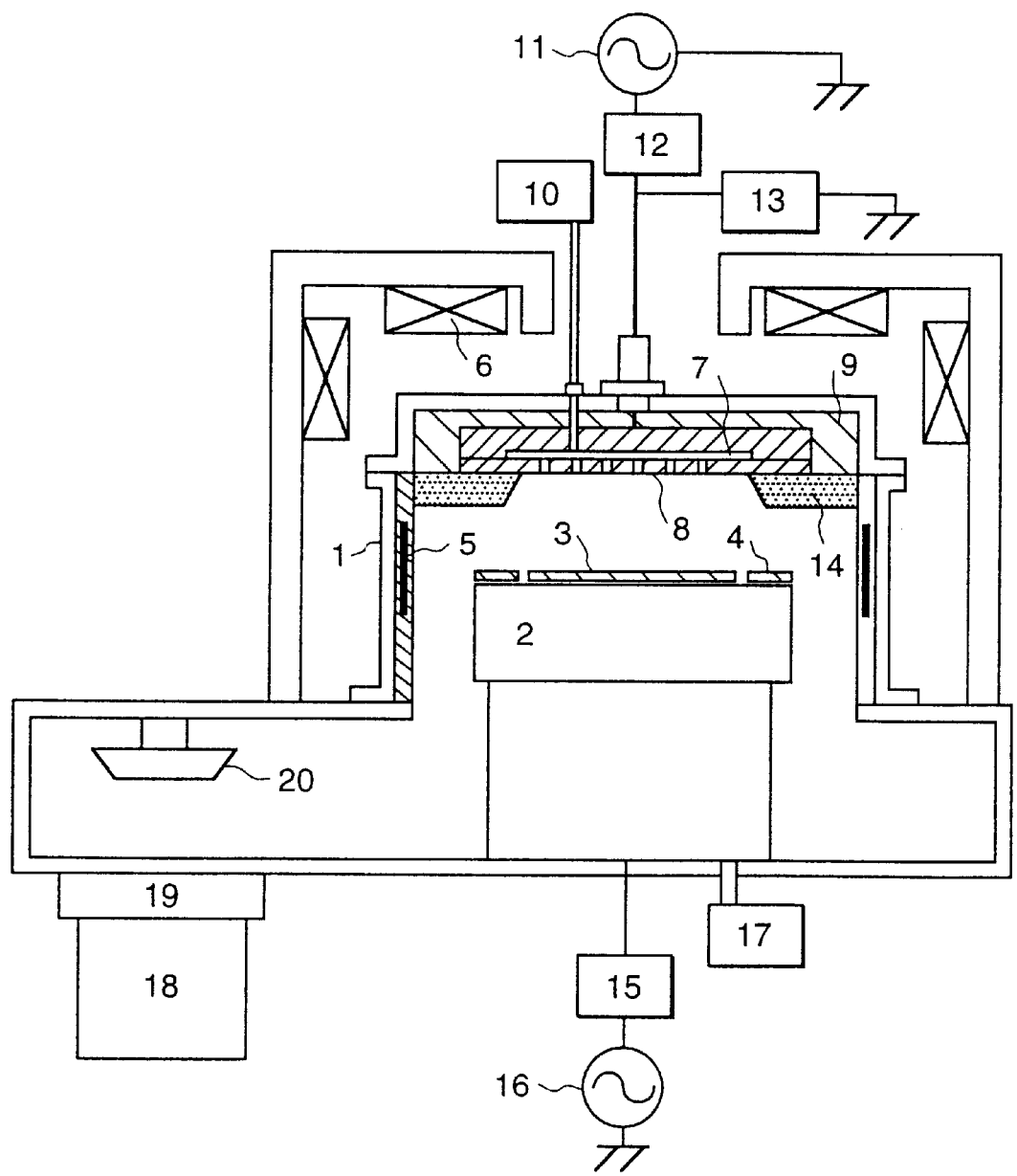
FIG. 3 is a cross sectional view showing a first embodiment of a plasma processing apparatus of the present invention.

The first embodiment of the present invention will be described hereunder. FIG. 3 shows an example in which the constitution of the present invention shown in FIG. 2A is applied to a UHF type ECR plasma etching apparatus. Inside a vacuum processing chamber 1, a wafer loading stage 2, a wafer 3, and an almost circular ring-shaped focus ring 4, which is electrically insulated from the wafer, are installed. A first temperature control device 5 for keeping the inner wall of the processing chamber at a constant temperature is installed. Outside the processing chamber, to generate a magnetic field for causing electron cyclotron resonance (ECR) in the processing chamber, a coil 6 is installed.

At the location opposite to the wafer 3; an almost disk-shaped antenna 7 for radiating UHF-band electromagnetic waves and a gas diffusion plate 8 for uniformly introducing processing gas into the processing chamber are arranged. Between the antenna and the ceiling, of the processing chamber, an antenna back dielectric member 9 is arranged. In the gas diffusion plate, several hundreds a fine holes with a diameter of about 0.3 to 0.6 mm are formed and the space between the gas diffusion plate and the antenna forms a buffer chamber for the processing gas. Processing gas is adjusted to a predetermined flow rate by a gas supply system 10 and is then introduced into the processing chamber via the gas diffusion plate 8.

The gas diffusion plate 8 and the antenna 7 also serve as an opposing ground electrode for the high frequency bias. Therefore, the gas diffusion plate is made of a material and is set to a thickness having no large impedance for the high frequency bias. As an example of the material, silicon, graphite, glassy carbon, aluminum alloy, or aluminum alloy with the surface anodized can be used. As the other materials, although metals can be used, materials causing heavy metal contamination, such as iron, nickel, and chromium, are not desirable. In this embodiment, silicon of 4 mm to 8 mm in thickness is used. (Hereinafter, in this embodiment, the antenna 7 and the gas diffusion plate 8 are called an opposing electrode in combination.)

the antenna 7, a UHF power source 11 for supplying power for generating a plasma to the processing chamber is connected via a first impedance matching box 12. To cause the gas diffusion plate 8 and the antenna 7 to function as an opposing ground electrode, the antenna is grounded via a filter 13. The filter 13 is designed so as not to let UHF-band electromagnetic waves for exciting the plasma pass, but will let only the frequency of a band used for wafer bias pass.

The frequency of the UHF power source, so as to lower the electron temperature of the plasma to prevent processing gas from excessive dissociation, is preferably within the band from 300 MHz to 1 GHz. In this embodiment, a frequency in the neighborhood of 450 MHz is used.

The outer periphery of the opposing electrode composed of the antenna and gas diffusion plate is covered with an almost circular ring-shaped dielectric ring 14. The dielectric ring plays a role of confining the generated plasma to the center part of the processing chamber and limiting the current path of the high frequency bias applied to a wafer to the opposing electrode by reducing the plasma density in the neighborhood of the side wall of the processing chamber. As a material of the dielectric ring 14, a material which is not deteriorated even if it is exposed to plasma and does not cause contamination easily, such as quartz, alumina, or aluminum nitride, is desirable.

The dielectric surface of the outer periphery of the opposing electrode, in order to interrupt the RF bias current from the lower electrode, protrudes about 3 mm to 20 mm from the opposing electrode surface perpendicularly to the opposing electrode surface.

To the wafer loading stage 2, a first high frequency power source 16 is connected via a second impedance matching box 15, and when a high frequency bias is applied to the wafer 3, ions generated by the plasma can be pulled in the wafer. At the same time, a high frequency bias can be applied also to the focus ring.

The frequency of a high frequency bias is selected to fall within the range from 400 kHz to 3 MHz so as to prevent the plasma distribution generated by the UHF-ECR from being affected significantly. When the frequency is in such a range, plasma generation due to the bias can be ignored and most of the input power can be used to pull ions into the wafer. In this embodiment, a frequency of 800 kHz is used.

The high frequency bias to be applied to the focus ring controls the radical amount contributing to etching, and, at the same time, plays a role of limiting the current path of the high frequency bias applied to the wafer 3 to the opposing electrode.

In the wafer loading stage 2, a second temperature control device 17 is installed so as to keep the wafer temperature constant during etching.

In the vacuum processing chamber 1, a turbo molecular pump 18 having an exhaust speed of about 2000 to 3000 L/s and a conductance adjustment valve 19 are installed and in the state in which processing gas is supplied, the processing chamber can be controlled to a predetermined pressure. A valve 20 for isolating the processing chamber from the turbo molecular pump when the processing chamber is to be opened to the air is installed.

Next, an embodiment of the etching process using the plasma etching equipment of the present invention will be explained.

A wafer to be subjected to the etching process is transferred into the vacuum processing chamber 1, which is in the state of being exhausted to a high vacuum, by a transfer arm from a transfer chamber not shown in the drawing, and the wafer is placed on the stage 2. The transfer arm moves backward, and the valve between the vacuum processing chamber 1 and the transfer chamber is closed, and then the stage 2 moves up and stops at a location suited to the processing.

Next, from the gas supply system 10, processing mixed gas adjusted to a predetermined flow rate is introduced into the processing chamber 1, and the pressure of the processing chamber is adjusted to a predetermined value by the conductance adjustment valve 19. In this embodiment, as processing gas, a mixed gas of Ar, $C_4F_8$, and $O_2$ is used, and the pressure is set to 2 Pa.

Next, a current is supplied to the coil 6 and a magnetic field is generated in the processing chamber so as to generate ECR by UHF electromagnetic waves. Next, power is supplied to the processing chamber 1 from the UHF power source 11 via the impedance matching box 12, and plasma at a density suited to processing is generated between the opposing electrode and the stage by the electron cyclotron resonance. In this embodiment, as a frequency of the UHF power source, 450 MHz is used. In this case, the magnetic flux density for generating ECR is 0.16 T.

After a plasma is ignited, though not shown in the drawing, from a DC power source connected in parallel with the high frequency power source 16, a DC high voltage is applied to the wafer loading stage 2, and the wafer 3 is electrostatically held by the stage. Helium gas is introduced to the back of the wafer, and due to the temperature-controlled stage 2, the wafer is kept at a constant temperature during processing.

Next, the high frequency power source 16 is operated and when a high frequency bias is applied to the wafer, the etching is started. Ions generated by the ma are pulled in to the wafer by the bias, so that etching of high anisotropy is available.

After the etching is carried out for a predetermined time, or after light emission from plasma is monitored, and the end point of etching is detected, and a predetermined over-etching is carried out, when the application of high frequency bias is stopped, the etching is finished.

After the end of etching, when the supply of the DC voltage used for electrostatically holding the wafer is stopped in the state in which discharge is maintained and the line used for supply of the DC voltage is grounded, the wafer is discharged via the plasma. By doing this, the wafer held by the wafer loading stage can be easily removed.

After the discharging step is finished, the supply of UHF power and the supply of coil power are stopped and the discharging is also stopped. Thereafter, the supply of processing gas is also stopped. The stage positioned at a location suited to the processing is lowered to the original location at the time of wafer transfer.

Thereafter, the processing gas in the processing chamber is exhausted, and then the valve between the processing chamber and the transfer chamber is opened. The wafer is then transferred to the transfer chamber. When there is a wafer to be processed next, the next wafer is processed again according to the aforementioned procedure.

The aforementioned process flow is typical of the etching steps.

According to this embodiment, when the plasma density in the outer periphery of the reactor is reduced by the dielectric ring 14 and the high frequency bias current from the focus ring 4 is supplied to the wall surface of the reactor, the current path of the high frequency bias applied to the wafer can be limited to only the area of the opposing electrode and the self bias potential on the wafer can be made uniform. By doing this, no current is supplied to the device via the plasma, so that an etching process without damage is available.

As a material for the dielectric ring, a material causing no contamination to a wafer, that is, quartz, aluminum oxide, aluminum nitride, or polyimide, is desirable. Needless to say, by changing the inner diameter and thickness of the dielectric ring and the taper angle of the inner wall, the effects can be adjusted.

As an example, assuming that the inner diameter of the dielectric ring is designated ø1, the outer diameter of the stage 2 is designated ø2, the outer diameter of a wafer is designated ø3, the distance between the wafer and the opposing electrode is designated H, and the thickness of the dielectric ring is designated t, in the case of only the dielectric ring shown in FIG. 1A, the following range is desirable:

$0.7ø3 < ø1 < ø2$, $0.05H < t < 0.5H$, and in the case of a combination of the dielectric and the focus ring (or ground) shown in FIG. 2A, the following range is desirable:

$$0.8\phi 3 < \phi < \phi 2, \ 0.05H < t < 0.3H$$

From the viewpoint of reduction of foreign substances, it is desirable if the corners of the dielectric ring are rounded at R=0.5 mm or more. When the dielectric ring is changed to a divided structure and the heat capacity is made smaller, the change with time of the etching process can be suppressed.

According to this embodiment, when a high frequency bias is applied also to the focus ring 4 in addition to the dielectric ring 14 and the current path of the high frequency bias applied to the focus ring is directed other than to the opposing ground, the current path of the wafer bias can be limited to only the area of the opposing electrode.

Figure 4:
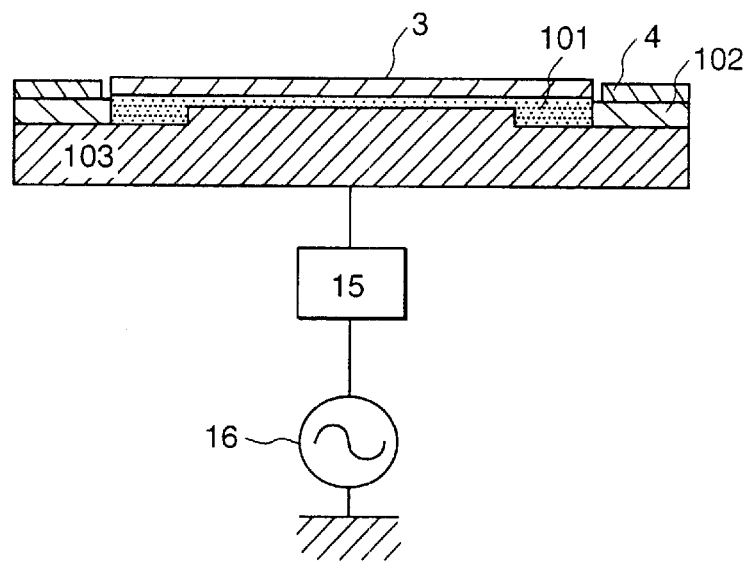
FIG. 4 is a cross sectional view showing an example of the bias compensation electrode in the embodiment shown in FIG. 3.

The structure around the electrode, including the focus ring, is shown in FIG. 4. The top of a lower electrode 103 is covered with an insulating film 101 of titania or polyimide; and, when a plasma is ignited and then a high DC voltage is applied to the electrode 2 from a DC power source not shown in the drawing, the wafer 3 is held electrostatically. Although not shown in the drawing, in the insulating film 101, a gas groove for supplying cooling helium gas is cut.

In the outer periphery of the electrode, the focus ring 4 is arranged. The focus ring, as described above, controls the current path of the wafer bias and also serves to control the radical density during etching, so that, as a material thereof, silicon, carbon, silicon carbide, or quartz is desirable.

When the material of the focus ring is a dielectric, such as quartz, by changing the thickness and width thereof, the rate of the high frequency bias power applied to a wafer and the high frequency bias power applied to the focus ring itself can be changed. When the material of the focus ring is a conductive material, such as carbon or doped silicon, by arranging a ring-shaped dielectric plate 102 between the electrode 2 and the focus ring 4 and by changing the material and thickness thereof, the high frequency bias power branched and applied to the focus ring can be controlled.

Furthermore, the thickness of the insulating film 101 has a distribution in the radial direction of the wafer so that the impedance up to the ground as viewed from the high frequency bias is made uniform on the wafer surface. Even if the plasma impedance has a distribution in the radial direction, when the thickness of the insulating film 101 is set so as to cancel it, the self bias potential on the wafer can be made uniform and damage can be prevented.

Figure 5:
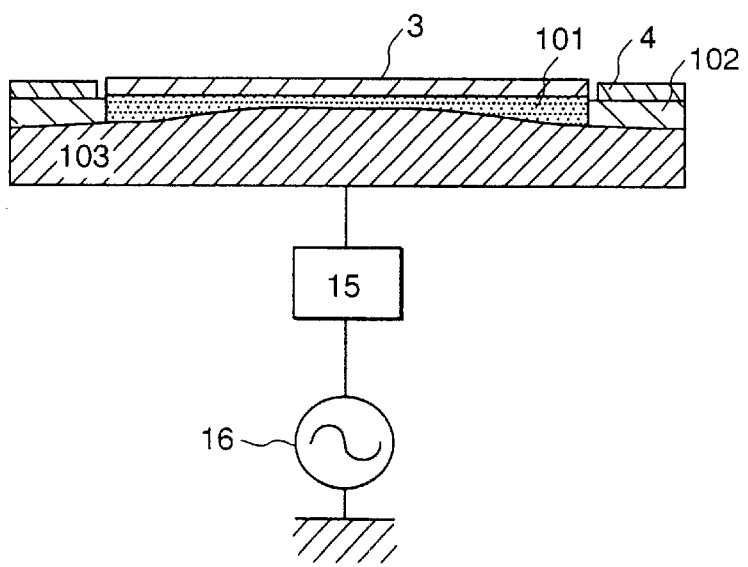
FIG. 5 is a cross sectional view showing another example of the bias compensation electrode in the embodiment shown in FIG. 3.

For example, when the absolute value of the self bias potential in the outer periphery of the wafer is larger than that at the center part, it is desirable to make the insulating film 101 thicker in the outer periphery. In correspondence to that, the voltage drop due to the insulating film at the outer periphery is slightly larger than that at the center, so that the occurrence of self bias potential can be suppressed. In FIG. 4, in consideration of ease of production, the thickness of the insulating film 101 is changed in a step state. As shown in FIG. 5, when the thickness of the insulating film 101 is changed smoothly, finer controllability can be expected. An electrode as explained above, in which the thickness of the insulating film 101 has a distribution and the self bias potential can be controlled, is hereinafter referred to as a bias compensation electrode.

Next, the results in which the effects of the present invention are experimentally verified will be described. Firstly, when the processing method of the present invention is not used, and the self bias potential Vdc at each location of a wafer is measured, the difference δVdc of Vdc between the center part of the wafer and the outer periphery is calculated, and the value of δVdc is found to be about 9 to 11 V, though it is slightly different depending on the conditions of power, pressure, and other factors.

When the processing method for installing the dielectric ring 14 is performed next, interrupting the current path of the wafer bias toward the side wall of the processing device, and hence limiting the current path of the wafer bias to the opposing electrode, δVdc is reduced to 3 to 8 V. Furthermore, in addition, when the processing method for optimizing the size of the focus ring 14 is used together with setting the current path of a high frequency bias applied to the focus ring to other than the opposing ground, and, hence, limiting the high frequency current path of the high frequency bias applied to the wafer to the opposing electrode positioned on the opposing surface of the wafer, δVdc is reduced to 0 to 5 V.

Next, the damage TEG is exposed to plasma and the TEG breakdown rate is examined. The TEG breakdown rate when the processing method of the present invention is not used is 21%. However, when the processing method in which δVdc is reduced to 0 to 5 V is used, the TEG breakdown rate is reduced to 4%. Furthermore, when the bias compensation electrode is used together with it and the processing method for making the impedance viewed from the high frequency bias uniform on the wafer surface is used, the TEG breakdown rate is 0%.

Figure 6:
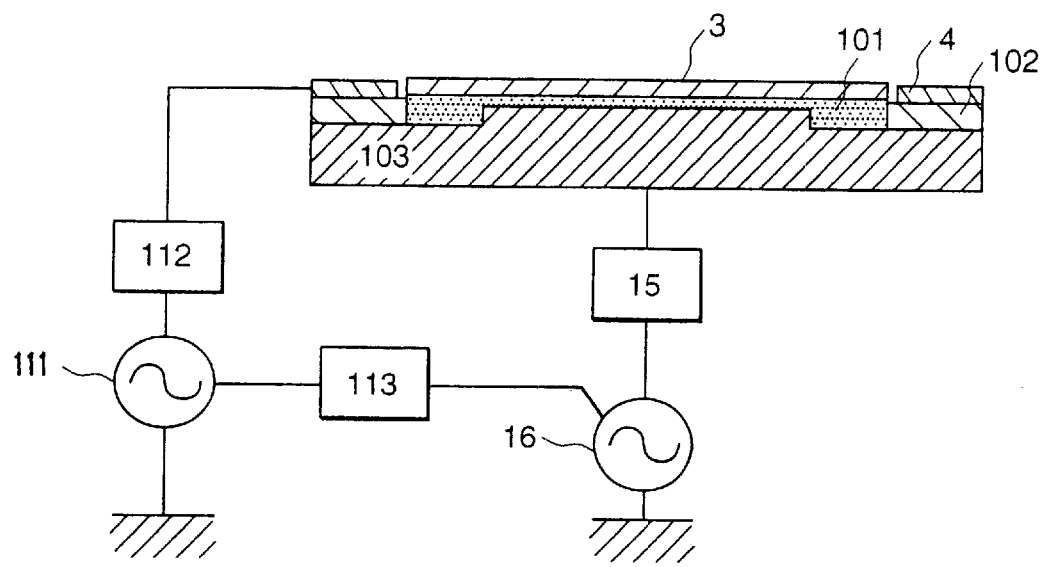
FIG. 6 is a cross sectional view showing an example of a method of supplying power to a focus ring.

In the constitution of the aforementioned bias compensation electrode, the high frequency bias applied to the focus ring 4 can be controlled by the thickness and width of the focus ring itself and the thickness of the ring-shaped dielectric plate 102. However, as shown in FIG. 6, when a second high frequency power source 111 is connected to the focus ring 4 via a third impedance matching box 112 and high frequency power is directly supplied, the bias amount of the focus ring can be controlled without changing the hardware.

In this case, the frequency of the second high frequency power source 111 is set to the same value as that of the first high frequency power source 16 and the phase of the high frequency bias applied to the wafer is set to almost the same value as the phase of the high frequency bias applied to the focus ring by a phase shifter 105. Although not shown in the drawing, even one high frequency power source can control the bias amount of the focus ring by using a power distributor without changing the hardware, such as changing the width of the focus ring.

Figure 7:
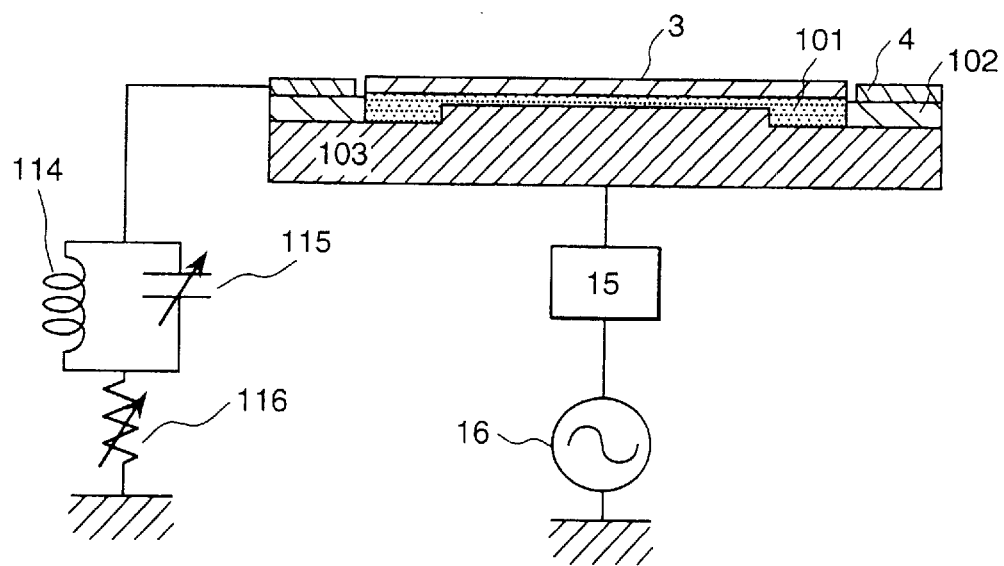
FIG. 7 is a cross sectional view showing an example of a means for controlling a self bias potential generated in the focus ring in the embodiment shown in FIG. 3.

As shown in FIG. 7, when the focus ring 4 is grounded via a filter composed of an inductance 114, a capacitance 115, and a variable resistor 116, by controlling the waveform of a high frequency voltage generated in the focus ring itself and the size of the self bias, the self bias potential on the wafer can be made uniform.

This embodiment has a structure such that due to the parallel resonance of the inductance 114 and the capacitance 115, the high frequency bias is prevented from directly flowing to the ground and the self bias generated in the focus ring itself is controlled by the variable resistor 116. However, the aforementioned filter structure is just an example and any filter producing the same effect may be used.

Figure 8:
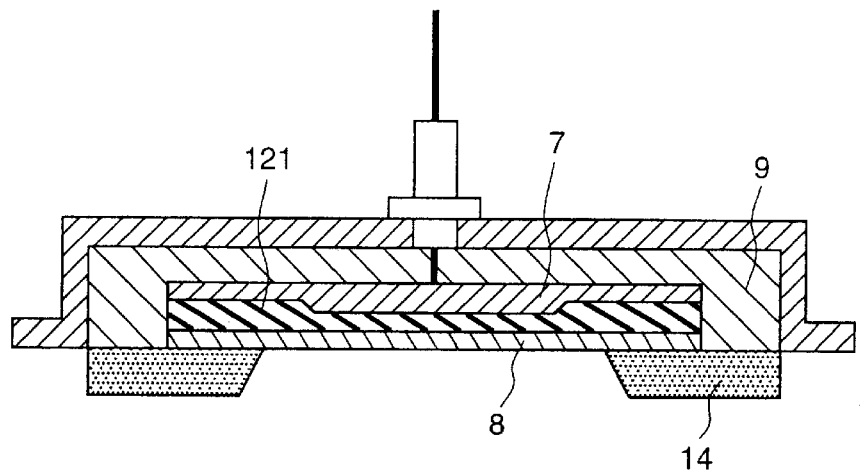
FIG. 8 is a cross sectional view showing an example of the bias compensation antenna in the embodiment shown in FIG. 3.

As shown in FIG. 8, when an under-antenna dielectric member 121 is arranged between the antenna 7 and the gas diffusion plate 8 and the thickness of the dielectric has member distribution a in the radial direction of the wafer so that the impedance up to the ground as viewed from the high frequency bias is made uniform on the wafer surface, damage can be prevented. Namely, even if the plasma impedance has a distribution in the radial direction in the same way as with the bias compensation electrode, when the thickness of the dielectric member 121 is set so as to cancel it, the self bias potential on the wafer can be made uniform and damage can be prevented.

For example, when the absolute value of the self bias potential at the outer periphery of the wafer is larger than that at the center, it is desirable to make the under-antenna dielectric member 121 thicker at the outer periphery. In correspondence to that, when the voltage drop due to the under-antenna dielectric member at the outer periphery is slightly larger than that at the center, the occurrence of self bias potential can be suppressed.

Figure 9:
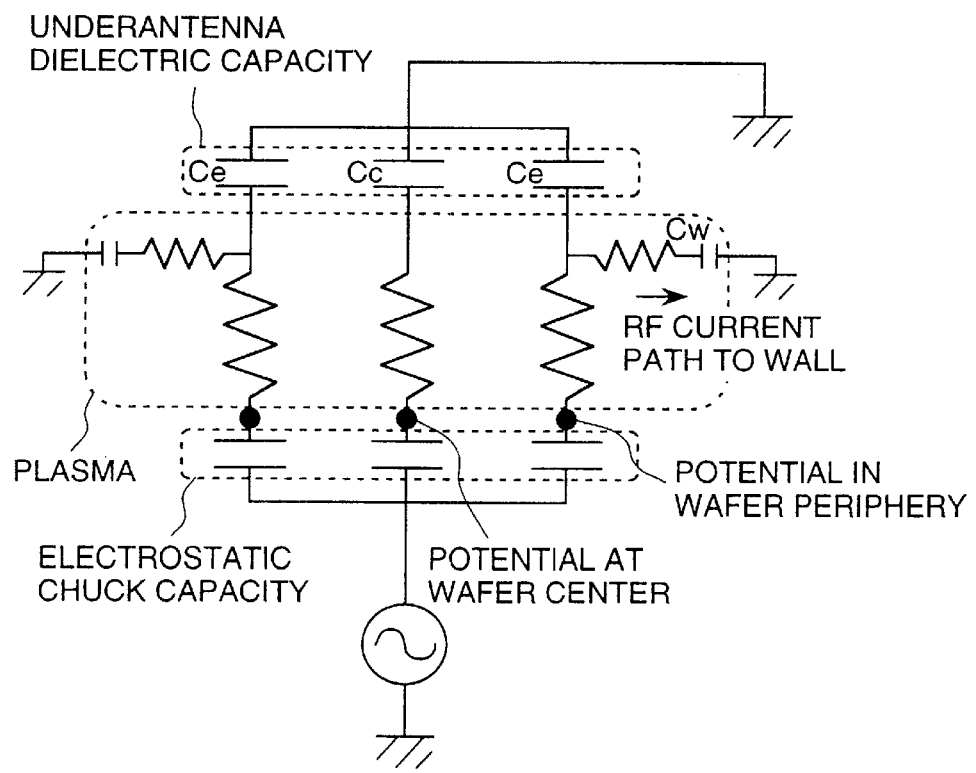
FIG. 9 is an equivalent circuit diagram of the bias compensation antenna shown in FIG. 8.

FIG. 9 shows an equivalent circuit of the bias compensation antenna shown in FIG. 8. At the outer periphery of the wafer, the effective ground area for the RF bias is wider than that at the center part and a self bias is generated. To compensate for this, it is desirable to set Cw so that Cc=Ce+Cw. Namely, it is desirable to set the film in the neighboring area of the under-antenna dielectric member so that it is thicker than that at the center part.

As mentioned previously, to limit the high frequency current path of the wafer bias to the opposing electrode and make the self bias potential on the wafer uniform, this embodiment uses a means for branching and applying the bias to the dielectric ring 14 and the focus ring 4 and to make the impedance up to the ground as viewed from the high frequency bias uniform on the wafer surface. In this regard, the embodiment uses a means in the form of the bias compensation electrode and bias compensation antenna. However, these are just examples and the present invention is not limited to these means. The point that a processing method is used which will make the self bias potential on the wafer uniform is important. The aforementioned means may be used independently or some of them may be combined.

This embodiment uses an UHF-ECR plasma source. This is also only one example, and the embodiment may employ a parallel plate type plasma source, an inductively coupled plasma source having an opposing electrode, and other plasma sources.

Figure 10:
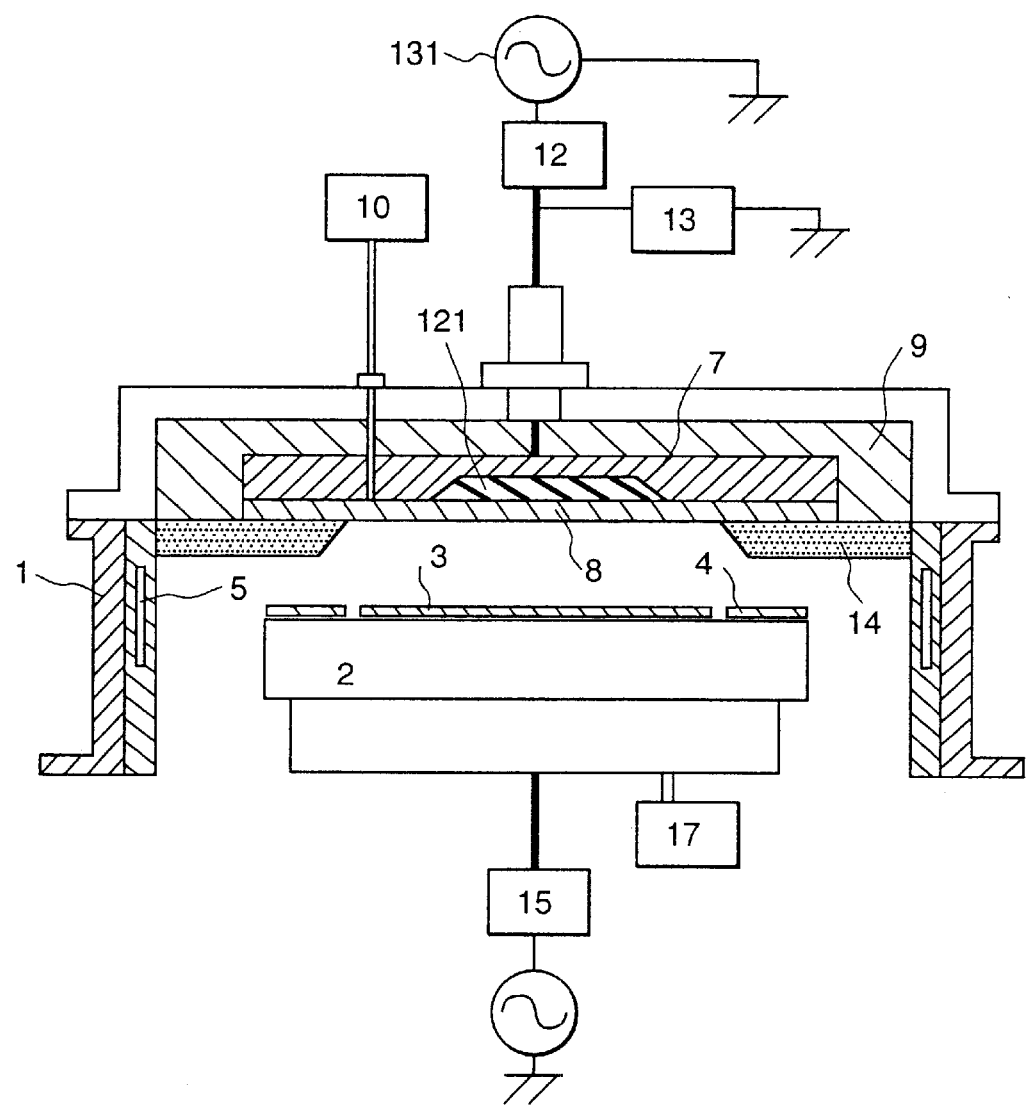
FIG. 10 is a cross sectional view showing a second embodiment of a plasma processing apparatus of the present invention.

Next, a second embodiment of the present invention will be described. For the parts of this embodiment which already have been explained in connection with the first embodiment, an explanation thereof will be omitted. FIG. 10 shows an example of a parallel plate type plasma etching apparatus. Inside a vacuum processing chamber 1, a wafer loading stage 2, a wafer 3, and an almost circular ring-shaped focus ring 4, which is electrically insulated from the wafer, are installed.

At the location opposite to the wafer loading stage, a bias compensation antenna composed of an antenna 7, a gas diffusion plate 8, and an under-antenna dielectric member 121 is arranged. To the antenna 7, a third high frequency power source 131 is connected via an impedance matching box 12.

As a frequency of the high frequency power source, a commercial frequency of 13.56 MHz has been often used. However, to process fine patterns in a good shape, it is essential to lower the pressure. Furthermore, since the frequency of the power source increases the plasma density in the low pressure area, it is desirable to set it to about 20 MHz to 100 MHz.

A no-magnetic field parallel plate type etching apparatus uses no magnetic field, so that the device is considered to be subject to damage. However, when it is driven at a low pressure, there is no effect of the plasma being confined by the magnetic field, and, due to the low pressure, the plasma diffusion speed is very fast and generated plasma is often spread up to the side wall of the processing chamber and below the wafer loading stage. Such a phenomenon not only causes a reduction in the processing efficiency, but also is not preferable from the viewpoint of damage.

According to this embodiment, the outer periphery of the opposing electrode is covered with an almost circular ring-shaped dielectric ring 14. The dielectric ring plays a role of confining the generated plasma to the center part of the processing chamber and limiting the current path of the high frequency bias applied to a wafer to the opposing electrode by reducing the plasma density in the neighborhood of the side wall of the processing chamber. By doing this, the self bias voltage on the wafer can be made uniform and damage can be prevented.

Furthermore, this embodiment has a bias compensation antenna structure, and the impedance up to the ground as viewed from the high frequency bias is made uniform on the wafer surface, so that damage can be prevented. In addition, a bias compensation electrode may be used together with this bias compensation antenna structure.

A point to be noted is that, compared with a case in which both the bias compensation antenna and bias compensation electrode are applied to a UHF-ECR plasma, the compensation effect must be designed to be lower. The reason for this is that there is no magnetic field from the beginning, so that the plasma impedance in the radial direction is not so large. When the compensation effect is too strong, it results in the damage being increased inversely. An important point is that the impedance up to the ground as viewed from the high frequency bias is strictly made uniform on the wafer surface. If the distribution of the plasma parameters, such as the plasma density and electron temperature, in the radial direction is almost uniform on the wafer and the plasma density in the neighborhood of the side wall of the processing chamber is sufficiently small, there is no need to use the bias compensation antenna.

Figure 11:
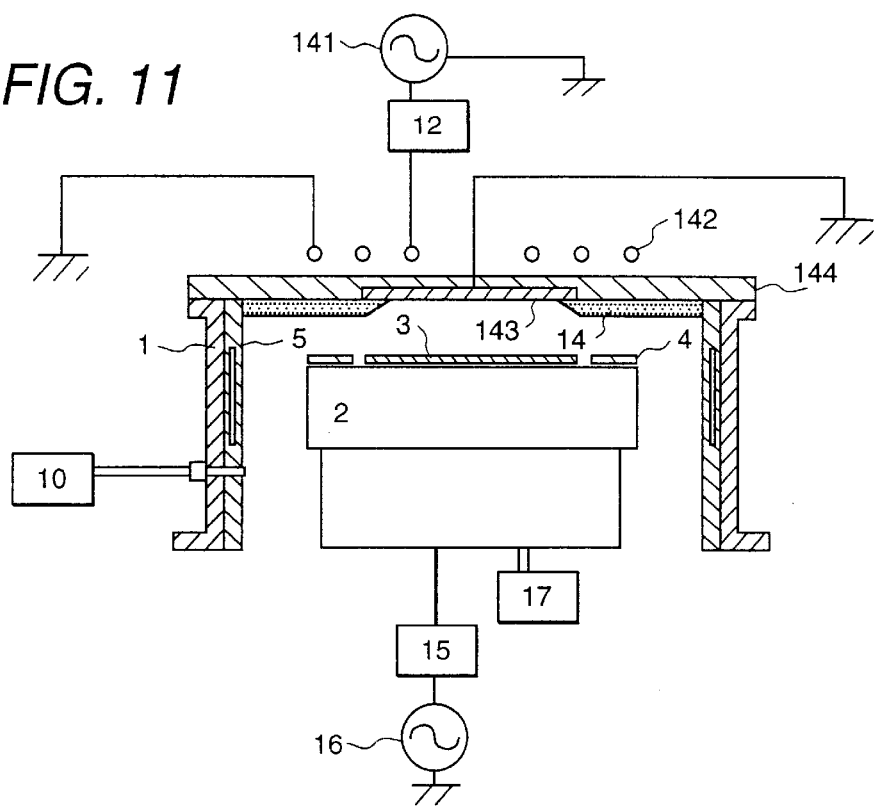
FIG. 11 is a cross sectional view showing a third embodiment of a plasma processing apparatus of the present invention.

Next, a third embodiment of the present invention will be described. For the parts of this embodiment which already have been explained in connection with the first embodiment, an explanation thereof will be omitted. FIG. 11 shows an example of an inductively coupled plasma etching apparatus. Inside a vacuum processing chamber 1, a wafer loading stage 2, a wafer 3, and an almost circular ring-shaped focus ring 4, which electrically insulated from the wafer, are installed.

At the location opposite to the wafer loading stage, a ceiling member 144, an opposing ground electrode 143, and a spiral antenna 142 are installed. The peripheral part of the opposing ground electrode 143 is covered with the almost circular ring-shaped dielectric ring 14. As a material of the opposing ground electrode, it is desirable to use silicon, graphite, glassy carbon, aluminum alloy, or aluminum alloy with the surface anodized.

To the spiral antenna 142, a fourth high frequency power source 141 is connected via the impedance matching box 12. In the plasma processing equipment of this embodiment, an alternating magnetic field is generated at the upper part of the processing chamber by supplying a high frequency current to the spiral antenna 141, and plasma is generated and maintained by the circumferential electric field induced by it.

As a frequency of the high frequency power source, it is desirable to use a frequency of about 400 kHz to 30 MHz. When the frequency is higher than this, the inductance of the spiral antenna increases excessively, and it is very difficult to adjust the impedance matching.

The dielectric ring 14 plays a role of confining the generated plasma in the center part of the processing chamber and limiting the current path of the high frequency bias applied to a wafer to the opposing ground electrode 143 by reducing the plasma density in the neighborhood of the side wall of the processing chamber. By doing this, the self bias voltage on the wafer can be made uniform and damage can be prevented.

Figure 12:
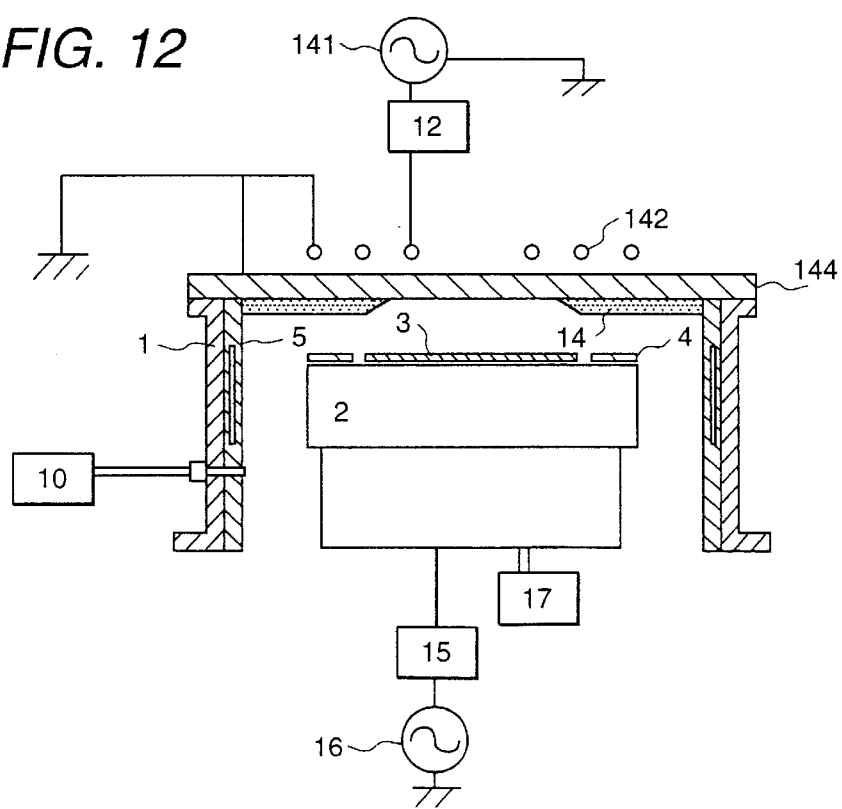
FIG. 12 is a cross sectional view showing a case in which the ceiling member serves as an opposing electrode in the third embodiment shown in FIG. 11.

When silicon having low impurity density is used as a material of the ceiling member, as shown in FIG. 12, the ceiling member can be operated as an opposing ground electrode. The conductivity of silicon having a low impurity density is very small; and, since it has a property similar to a dielectric, the electromagnetic field generated by the spiral antenna 142 can enter the processing chamber, and plasma can be generated and maintained. On the other hand, when the ceiling member is grounded, it can be regarded as an opposing ground by the high frequency bias.

By use of such a device constitution, when the current path of a high frequency bias to be applied to a wafer is limited to the ceiling member 144 operating as an opposing ground electrode, the self bias voltage on the wafer can be made uniform and damage can be prevented. The opposing ground electrode 143 is unnecessary, and so the number of parts can be reduced, which is helpful in decreasing the cost of the apparatus.

When silicon is used as a material of the dielectric ring 14 and the dielectric ring 14 is integrated with the ceiling member 144, further reduction in the number of parts and simplification of the device structure are realized and the maintainability is improved.

As explained above, according to the present invention, the following good results can be obtained.

In a plasma processing apparatus having an opposing electrode, since the self bias potential on a wafer, which is generated when a wafer bias is input, is made uniform, no current flows through the device via the plasma, so that macro damage can be prevented.

When the current path of a high frequency bias supplied to the wafer is limited to the opposing electrode, the self bias potential on the wafer can be made uniform and macro damage can be prevented.

In a plasma processing apparatus having a focus ring made of an almost circular ring-shaped dielectric or conductor insulated from a wafer at the outer periphery of the wafer, and including an opposing electrode at the location opposite to the wafer, by setting the current path of a high frequency bias to be applied to the focus ring to other than the opposing electrode and limiting the current path of a high frequency bias applied to the wafer to the opposing electrode, the self bias potential on the wafer can be made uniform and macro damage can be prevented.

The impedance up to the ground as viewed from the high frequency bias is made uniform on the wafer surface, so that the self bias potential on the wafer can be made uniform and macro damage can be prevented.

In a plasma processing apparatus having an opposing electrode, when the plasma density in the outer periphery of a reactor is reduced by covering the outer periphery of the opposing electrode with an insulator and the high frequency bias current path to the side wall is interrupted, the current path of the wafer bias can be limited to the opposing electrode. By doing this, the self bias potential on the wafer can be made uniform and macro damage can be prevented. In correspondence to a reduction in the plasma density in the outer periphery, the plasma density right above the wafer is increased, so that the power use efficiency in the process of plasma generation can be increased.

What is claimed is:

1. A plasma processing equipment having a vacuum processing chamber, plasma generation means, a stage for loading a wafer to be processed in said vacuum processing chamber, an opposing electrode having an area almost equal to or wider than said wafer which is installed opposite to said stage, and a bias power source for applying a high frequency bias to said wafer, wherein current path correction means for correcting a current path part in the neighborhood of the outer periphery of said wafer among a high frequency current path by said high frequency bias so as to look toward the wafer opposing surface of said opposing electrode is installed.

2. A plasma processing equipment having a vacuum processing chamber, plasma generation means, a stage for loading a wafer to be processed in said vacuum processing chamber, an opposing electrode having an area almost equal to or wider than said wafer which is installed opposite to said stage, a ground, and a bias power source for applying a high frequency bias to said wafer, wherein impedance adjustment means for making impedance up to said ground viewed from said high frequency bias almost uniform in said wafer surface is included.

3. A plasma processing equipment having a vacuum processing chamber, plasma generation means, a stage for loading a wafer to be processed in said vacuum processing chamber, an opposing electrode having an area almost equal to or wider than said wafer which is installed opposite to said stage, and a bias power source for applying a high frequency bias to said wafer and serving as a role of an antenna for radiating electromagnetic waves so as to generate and maintain plasma by said opposing electrode, wherein current path correction means for correcting a current path part in the neighborhood of the outer periphery of said wafer among a high frequency current path by said high frequency bias so as to look toward the wafer opposing surface of said opposing electrode is installed.

4. A plasma processing equipment having a vacuum processing chamber, plasma generation means, a stage for loading a wafer to be processed in said vacuum processing chamber, an opposing electrode having an area almost equal to or wider than said wafer which is installed opposite to said stage, and a bias power source for applying a high frequency bias to said wafer and serving as a role of an antenna for radiating electromagnetic waves so as to generate and maintain plasma by said opposing electrode, wherein impedance adjustment means for making impedance up to said ground viewed from said high frequency bias almost uniform in said wafer surface is included.

5. A plasma processing equipment according to any of claims 1 to 4, wherein said wafer opposing surface in the outer periphery of said opposing electrode is covered with a dielectric.

6. A plasma processing equipment according to claim 5, wherein said dielectric surface in said outer periphery of said opposing electrode is protruded about 3 mm or more from said opposing electrode surface perpendicularly to said opposing electrode surface.

7. A plasma processing equipment according to claim 5, wherein said dielectric covering said outer periphery of said opposing electrode is composed of quartz, aluminum oxide, aluminum nitride, or polyimide.

8. A plasma processing equipment according to claim 5, wherein the outer diameter of said opposing electrode is larger than the outer diameter ø3 of said wafer and the outer diameter ø1 of the plasma contact part of said opposing electrode is within the range from 0.7 ø3 to 1.3 ø3.

9. A plasma processing equipment according to any of claims 1 to 4, wherein said device has a focus ring which is an almost circular ring-shaped conductor or dielectric insulated from said wafer in the outer periphery of said stage and a high frequency bias is applied to said focus ring.

10. A plasma processing equipment according to any of claims 1 to 4, wherein said wafer opposing surface in the outer periphery of said opposing electrode is covered with a dielectric, and said device has a focus ring which is an almost circular ring-shaped conductor or dielectric insulated from said wafer in the outer periphery of said stage, and a high frequency bias is applied to said focus ring.

11. A plasma processing equipment according to claim 9, wherein from the same power source as said bias power source for said wafer, a high frequency bias is applied to said focus ring via a thin insulator.

12. A plasma processing equipment according to claim 9, wherein as control means for controlling the waveform of said high frequency bias applied to said focus ring, said focus ring is grounded via a filter.

13. A plasma processing equipment according to claim 9, wherein as control means of said high frequency bias applied to said focus ring, a second bias power source different from said bias power source of said wafer is used.

14. A plasma processing equipment according to claim 9, wherein the material of said focus ring is silicon, carbon, or silicon carbide.

15. A plasma processing equipment having a vacuum processing chamber, evacuation means, plasma generation means, plasma generation gas supply means, a stage for loading a wafer to be processed in said vacuum processing chamber, and an opposing electrode having an area almost equal to or wider than said wafer at a location opposite to said stage, wherein impedance for a high frequency bias of said opposing electrode is larger on the outer side in the radial direction of said wafer than on the inner side.

16. A plasma processing equipment according to claim 15, wherein said opposing electrode is composed of a laminated structure of a conductor, dielectric, and conductor.

17. A plasma processing equipment according to claim 15 or 16, wherein the thickness of said dielectric of said opposing electrode is different in the radial direction of said wafer.

18. A plasma processing equipment according to any one of claims 1 to 4 and 15, wherein the material of said opposing electrode is silicon, carbon, aluminum, or anodized aluminum.

19. A plasma processing equipment having a vacuum processing chamber, plasma generation means, a stage for loading a wafer to be processed in said vacuum processing chamber, an opposing electrode having an area almost equal to or wider than said wafer which is installed opposite to said stage, and a bias power source for applying a high frequency bias to said wafer, wherein means for controlling a difference of self bias potential on said wafer which is generated when said high frequency bias power source is turned on to 5 V or less is included.

20. A plasma processing method by a plasma processing equipment having a vacuum processing chamber, plasma generation means, a stage for loading a wafer to be processed in said vacuum processing chamber, an opposing electrode having an area almost equal to or wider than said wafer which is installed opposite to said stage, and a bias power source for applying a high frequency bias to said wafer and including current path correction means for correcting the current path part in the neighborhood of the outer periphery of said wafer among the high frequency current path by said high frequency bias so as to look toward said wafer opposing surface of said opposing electrode comprises a step of introducing processing gas into said vacuum processing chamber, a step of turning power on, igniting plasma, applying a high frequency bias to said wafer, and generating uniform self bias potential on said wafer when said high frequency bias is applied by said current path correction means, and a step of processing said wafer by said plasma.

21. A plasma processing equipment according to claim 10, wherein from the same power source as said bias power source for said wafer, a high frequency bias is applied to said focus ring via a thin insulator.

22. A plasma processing equipment according to claim 10, wherein as control means for controlling the waveform of said high frequency bias applied to said focus ring, said focus ring is grounded via a filter.

23. A plasma processing equipment according to claim 10, wherein as control means of said high frequency bias applied to said focus ring, a second bias power source different from said bias power source of said wafer is used.

24. A plasma processing equipment according to claim 10, wherein the material of said focus ring is silicon, carbon, or silicon carbide.

* * * * *